US006818864B2

(12) United States Patent
Ptak

(10) Patent No.: US 6,818,864 B2
(45) Date of Patent: Nov. 16, 2004

(54) LED HEAT LAMP ARRAYS FOR CVD HEATING

(75) Inventor: John C. Ptak, Phoenix, AZ (US)

(73) Assignee: ASM America, Inc., Phoenix, AZ (US)

(*) Notice: Subject to any disclaimer, the term of this patent is extended or adjusted under 35 U.S.C. 154(b) by 78 days.

(21) Appl. No.: 10/217,230

(22) Filed: Aug. 9, 2002

(65) Prior Publication Data

US 2004/0026400 A1 Feb. 12, 2004

(51) Int. Cl.$^7$ .................................................. F27B 5/14
(52) U.S. Cl. .................... 219/390; 219/405; 219/411; 118/724; 118/725; 118/50.1; 392/416; 392/418
(58) Field of Search ................................ 219/390, 405, 219/411; 118/724, 725, 50.1; 392/416, 418

(56) References Cited

U.S. PATENT DOCUMENTS

| 3,636,398 A | 1/1972 | Boyce |
| 3,796,009 A | 3/1974 | Shimotsuma et al. |
| 3,836,751 A | 9/1974 | Anderson |
| 3,969,943 A | 7/1976 | Ohno et al. |
| 4,255,133 A | 3/1981 | Tanifuji et al. |
| 4,349,869 A | 9/1982 | Prett et al. |
| 4,358,822 A | 11/1982 | Sanchez |
| 4,430,959 A | 2/1984 | Ebata et al. |
| 4,435,092 A | 3/1984 | Iuchi |
| 4,616,308 A | 10/1986 | Morshedi et al. |
| 4,634,946 A | 1/1987 | Moulds, III et al. |
| 4,639,853 A | 1/1987 | Rake et al. |
| 4,680,451 A | 7/1987 | Gat et al. |
| 4,688,180 A | 8/1987 | Motomiya |
| 4,694,390 A | 9/1987 | Lee |
| 4,714,988 A | 12/1987 | Hiroi et al. |
| 4,720,807 A | 1/1988 | Ferran et al. |
| 4,736,316 A | 4/1988 | Wallman |
| 4,761,538 A | 8/1988 | Chiba et al. |

(List continued on next page.)

FOREIGN PATENT DOCUMENTS

| CA | 2054423 | 2/1993 |
| EP | 0037579 | 10/1981 |
| EP | 0 416 944 A1 | 3/1991 |
| EP | 0 594 183 A1 | 4/1994 |
| EP | 0 594 183 B1 | 4/1994 |
| EP | 0 720 730 B1 | 7/1996 |
| EP | 0 829 784 A1 | 3/1998 |
| JP | 0114727 | 5/1989 |

OTHER PUBLICATIONS

Terence Breedijk, et al., "A Model Predictive Controller for Multivariable Temperature Control in Rapid Thermal Processing," XP000410804, presented at American Control Conference, 1993, San Francisco, California, published Feb. 6, 1993, DG1: Library, vol. 3 of 3, p. 2980–2984.

(List continued on next page.)

Primary Examiner—Shawntina Fuqua
(74) Attorney, Agent, or Firm—Knobbe Martens Olson & Bear LLP

(57) ABSTRACT

A reactor chamber is positioned between a top array of LED heat lamps and a bottom array of LED heat lamps. The LED heat lamps forming the top and bottom arrays are individually or controllable in groups such that power output along each array of LED heat lamps can dynamically differ. The LED lamps can be controlled in response to, for example, feedback from chamber sensors, a desired temperature profile, and a failed LED lamp. In this way, the methods and systems described herein can dynamically compensate for operational characteristics of the reactor chamber. In one configuration, the LED heat lamps are arranged in a rectangular pattern. In some configurations, the LED heat lamps are arranged in a circular or a concentric pattern.

32 Claims, 8 Drawing Sheets

U.S. PATENT DOCUMENTS

| | | | |
|---|---|---|---|
| 4,769,766 A | 9/1988 | Tung | |
| 4,828,224 A | 5/1989 | Crabb et al. | |
| 4,836,138 A | 6/1989 | Robinson et al. | |
| 4,854,727 A | 8/1989 | Pecot et al. | |
| 4,890,245 A | 12/1989 | Yomoto et al. | |
| 4,904,912 A | 2/1990 | Yamamoto | |
| 4,913,790 A | 4/1990 | Narita et al. | |
| 4,919,542 A | 4/1990 | Nulman et al. | |
| RE33,326 E * | 9/1990 | Ebata et al. | 118/697 |
| 4,959,767 A | 9/1990 | Buchner et al. | |
| 4,969,748 A | 11/1990 | Crowley et al. | |
| 4,975,561 A | 12/1990 | Robinson et al. | |
| 4,984,902 A | 1/1991 | Crowley et al. | |
| 5,010,659 A | 4/1991 | Treleven | |
| 5,032,977 A | 7/1991 | Beller et al. | |
| 5,098,198 A | 3/1992 | Nulman et al. | |
| 5,099,442 A | 3/1992 | Furuta et al. | |
| 5,156,461 A | 10/1992 | Moslehi et al. | |
| 5,221,556 A | 6/1993 | Hawkins et al. | |
| 5,225,245 A | 7/1993 | Ohta et al. | |
| 5,291,514 A | 3/1994 | Heitmann et al. | |
| 5,301,101 A | 4/1994 | MacArthur et al. | |
| 5,377,126 A | 12/1994 | Flik et al. | |
| 5,488,561 A | 1/1996 | Berkowitz et al. | |
| 5,549,756 A | 8/1996 | Sorensen et al. | |
| 5,623,149 A | 4/1997 | Kilmer | |
| 5,660,472 A | 8/1997 | Peuse et al. | |
| 5,707,146 A | 1/1998 | Gaus et al. | |
| 5,740,314 A | 4/1998 | Grimm | |
| 5,743,644 A | 4/1998 | Kobayashi et al. | |
| 5,755,511 A | 5/1998 | Peuse et al. | |
| 5,790,750 A | 8/1998 | Anderson | |
| 5,793,022 A | 8/1998 | Klinck et al. | |
| 5,802,099 A | 9/1998 | Curran et al. | |
| 5,820,261 A | 10/1998 | Yam | |
| 6,093,252 A | 7/2000 | Wengert et al. | |
| 6,143,079 A | 11/2000 | Halpin | |
| 6,191,399 B1 | 2/2001 | Van Bilsen | |
| 6,205,677 B1 | 3/2001 | Yune | |
| 6,207,936 B1 | 3/2001 | de Waard et al. | |
| 6,373,033 B1 | 4/2002 | de Waard et al. | |
| 6,598,559 B1 * | 7/2003 | Vellore et al. | 118/723 VE |

OTHER PUBLICATIONS

J. Bordeneuve, et al., "Long–range predictive control of a rapid thermal processor," XP–002081214, Int. J. Systems SCI., 1991, vol. 22, No. 1232377–2391.

David W. Clarke, "Application of Generalized Predictive Control to Industrial Processes," IEEE, Control Systems Rajatine, vol. 8, pp. 49–55, 1988.

D.W. Clarke, et al., "Generalized Predictive Control—Part I. The Basic Algorithm," Automatica vol. 23, No. 2, pp. 137–148, 1987.

D.W. Clarke, et al., "Generalized Predictive Control—Part II. Extensions and Interpretations," Automatica, vol. 23, No. 2, pp. 149–160, 1987.

D.J. Cloud, et al., "Characteristic decomposition and the multivariable generalisation of predictive self–tuning control."

Bruce P. Gibbs, et al., "Applications Of Nonlinear Model––Based Predicitive Control To Fossil Power Plants," T3–5–4:20; Proceedings of the $30^{th}$ IEEE Conference On Decision And Control, Dec. 11–13, 1991, Metropole Hotel, Brighton, England; vol. 2 of 3; Ch3076–7/91/000–1850; 1991 IEEE.

A. Karaduman, et al., "Nonlinear Model Predictive Temperature Control Of A Batch Polymerization Reactor", ICHEME—Advances in Process Control 4:XP–002081211.

V.R. Karla, et al., "Neural–network–based Model Predictive Control: A Case Study," XP–002081213, 0–8186–7174–2/95M, 1995, IEEE.

F. Lebourgeois, "IDCOM Applications And Experiences On A PVC Production Plant," Rhone–Poulenc Industries, St–Fons, France, FA9–C.

J. Richalet, et al., "Model Predictive Heuristic Control: Applications to Industrial Processes," Automatica, vol. 14, pp. 413–428, 1978.

F. Roozeboom, et al., "Rapid thermal processing systems: A review with emphasis on temperature control," J.Vac.Sci. Technol. B 8 (6), Nov./Dec., 1990, pp. 1249–1259.

Kwaku O. Temeng, et al., "Model predictive control of an industrial packed bed reactor using neural networks," Butterworth Heinemann, J. Proc., Cont. vol. 5, No. 1, 1995 Elsevier Science Ltd.

Deng Xiaosong, et al., "Real–Time Identification And Control Of A Continuous Stirred Tank Reactor With Neural Network," XP–002081212, 0–7803–2081–6/95, 1995, IEEE.

International Search Report for PCT/US03/22402, mailed Oct. 15, 2003.

* cited by examiner

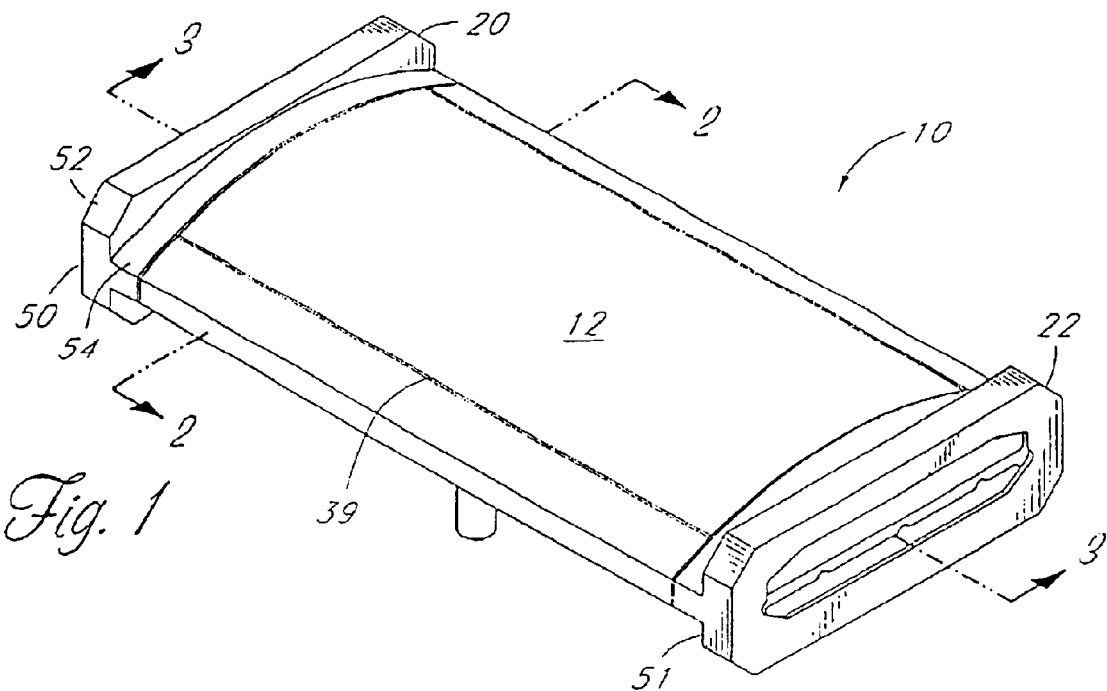
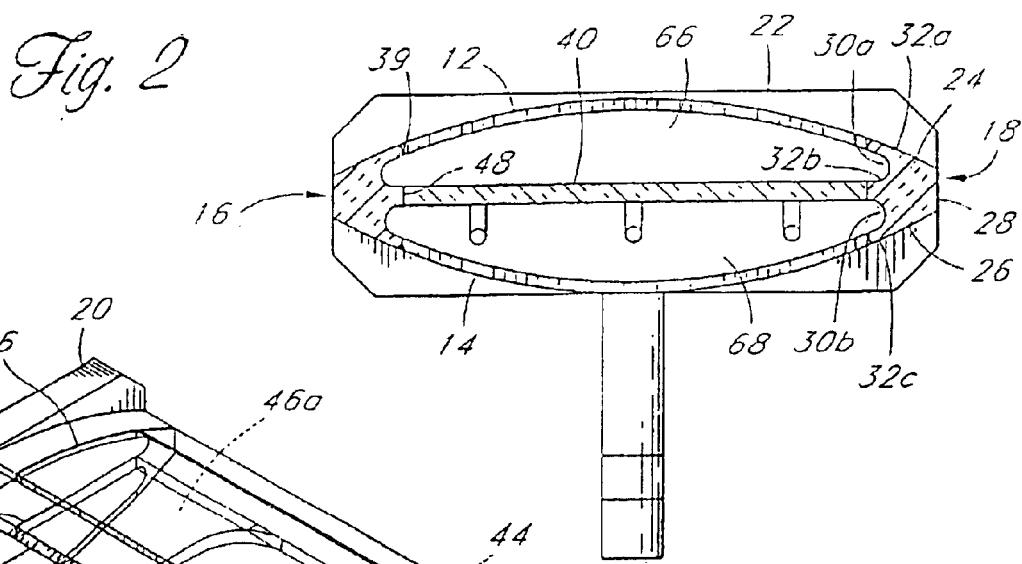
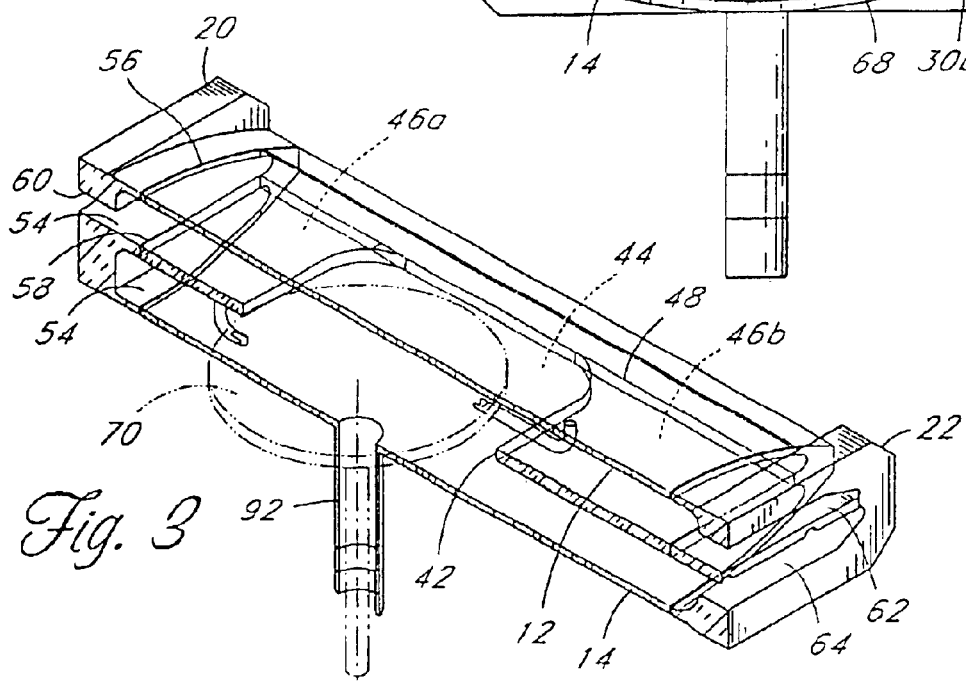

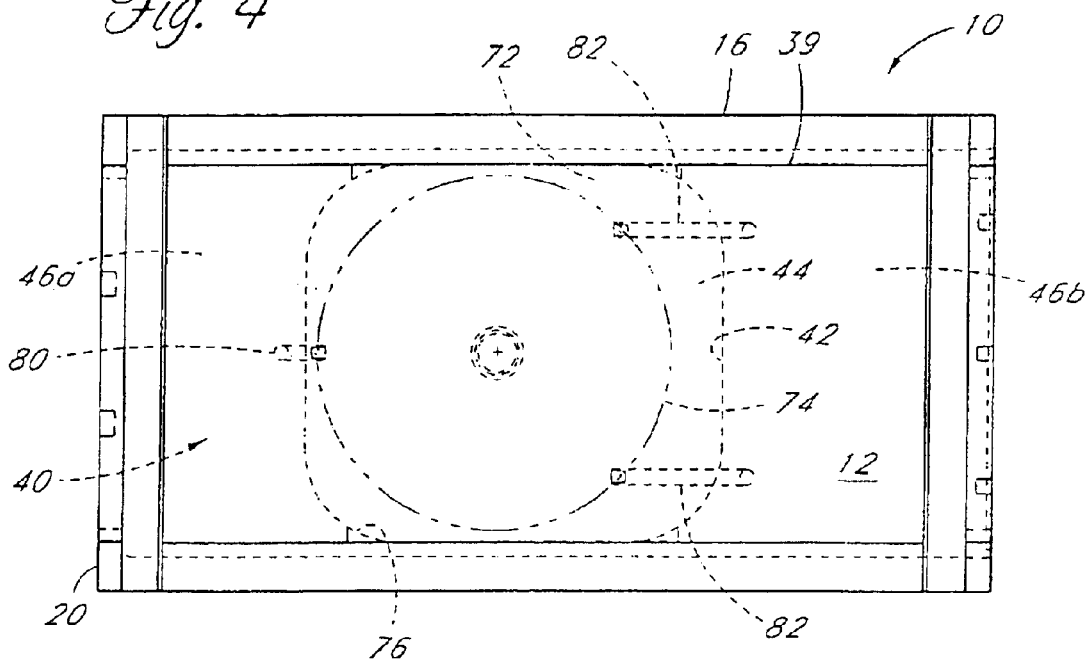
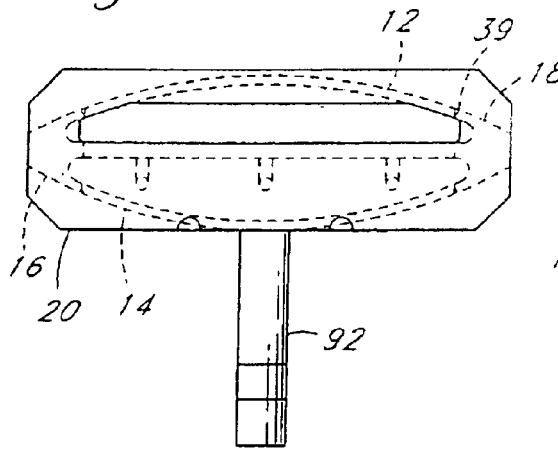
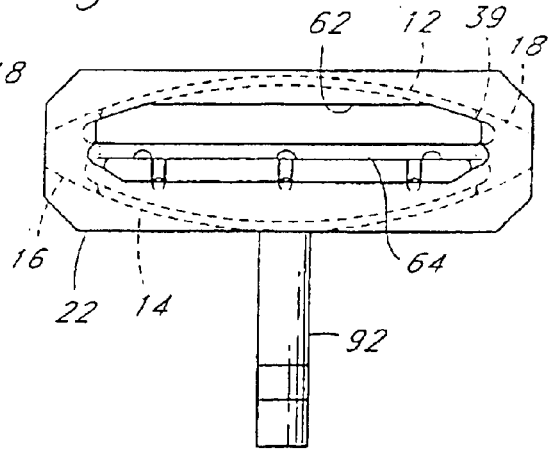
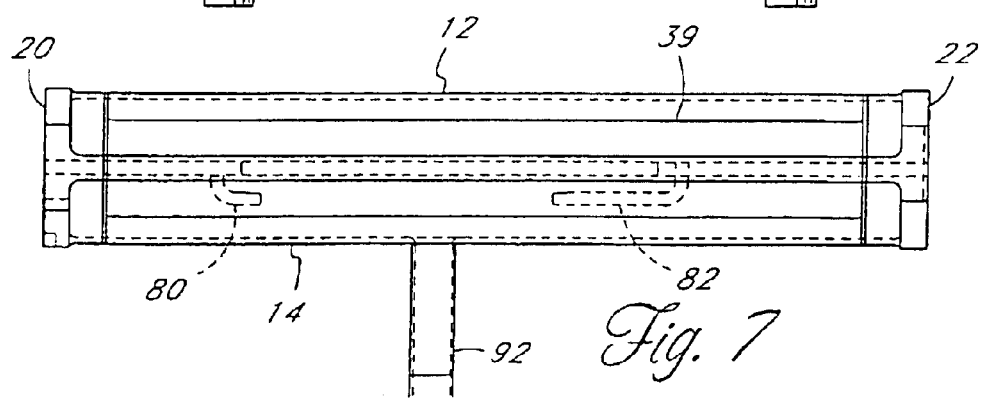

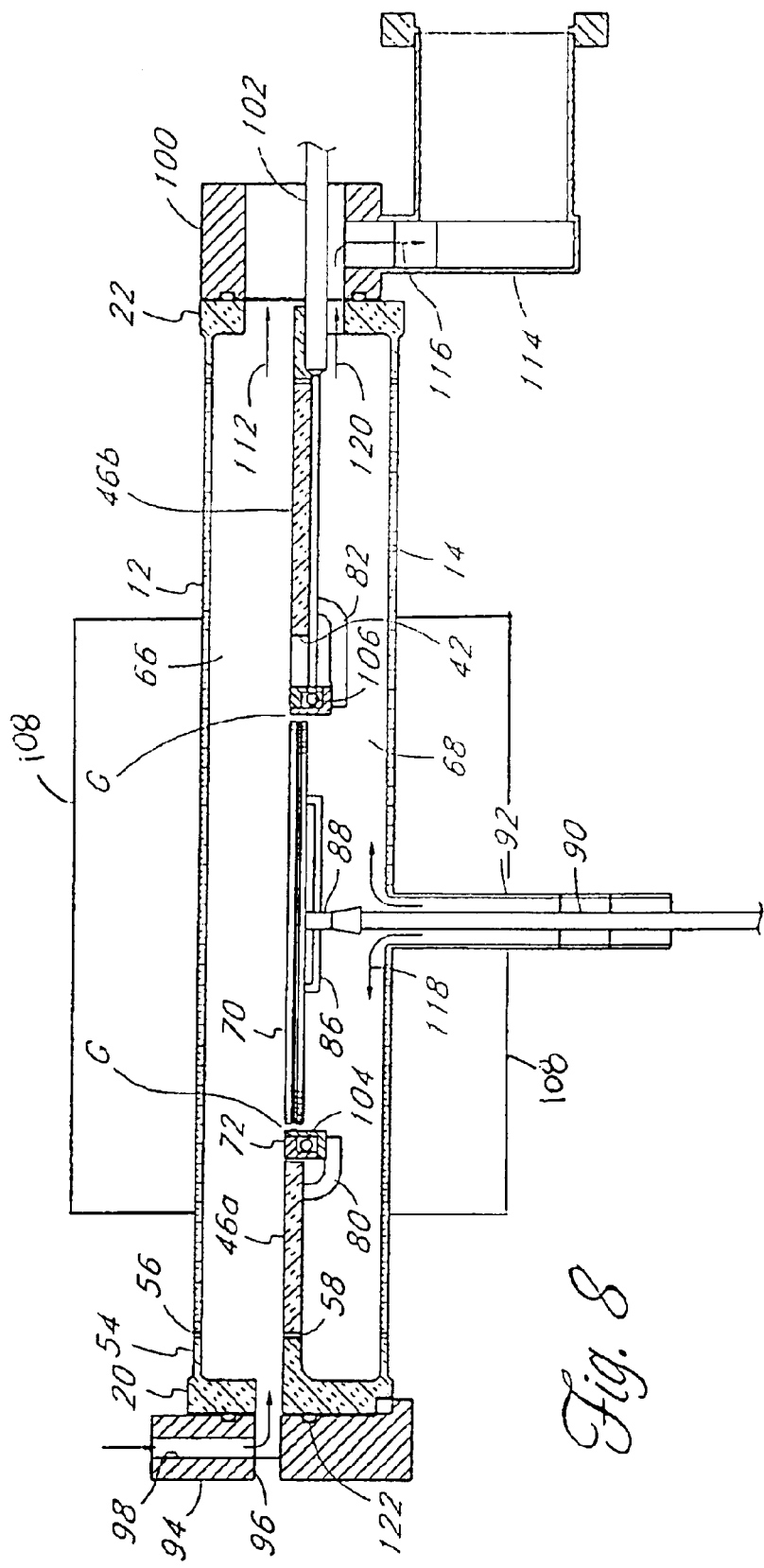

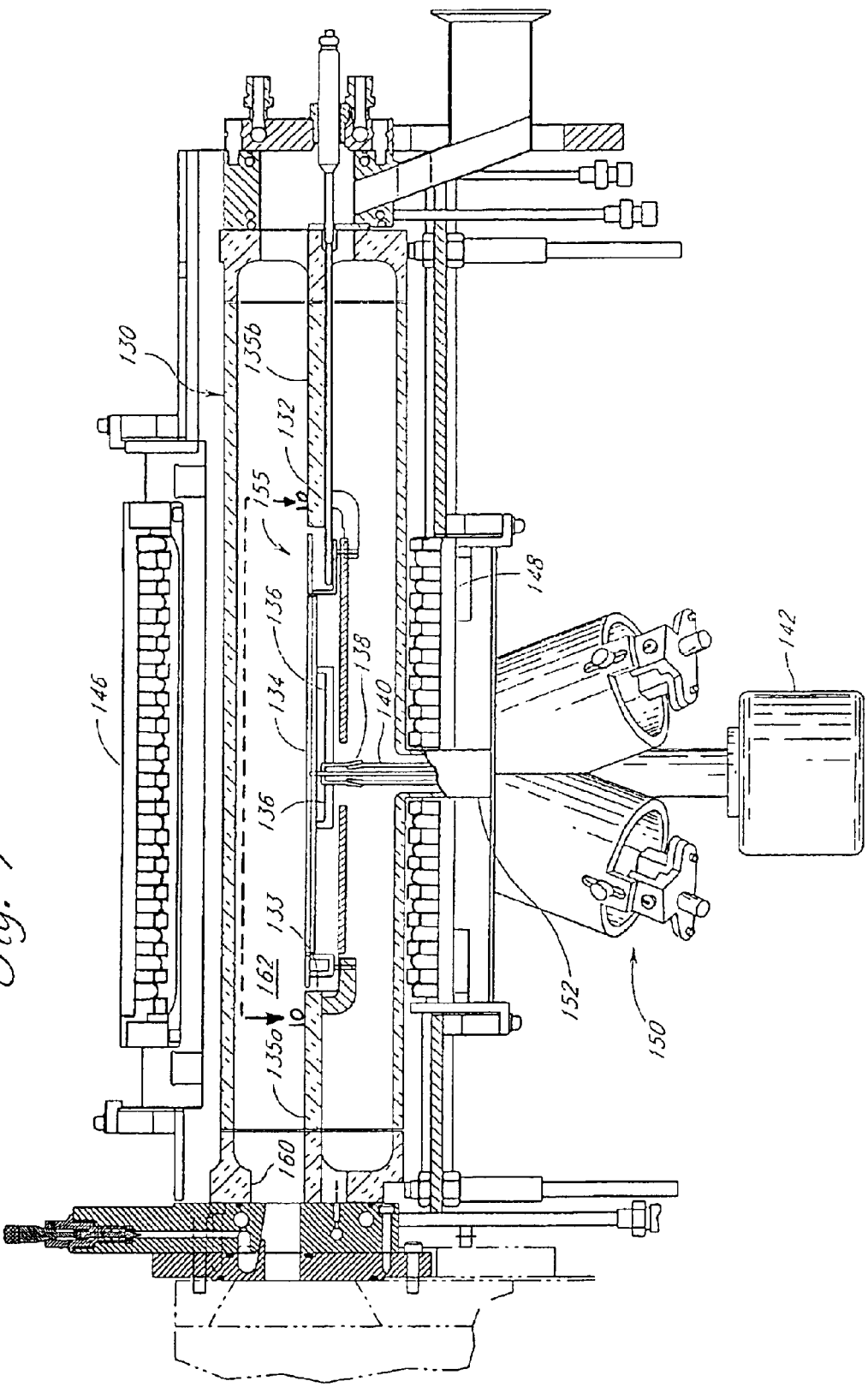

LED HEAT LAMP ARRAYS FOR CVD HEATING

BACKGROUND OF THE INVENTION

1. Field of the Invention

The present invention generally relates to heat lamps. More specifically, the present invention relates to heat lamps for improving the temperature uniformity in a field heated by one or more LED heat lamps.

2. Related Art

Chemical vapor deposition (CVD) is a very well known process in the semiconductor industry for forming thin films of materials on substrates, such as silicon wafers. In a CVD process, gaseous molecules of the material to be deposited are supplied to wafers to form a thin film of that material on the wafers by chemical reaction. Such formed thin films may be polycrystalline, amorphous or epitaxial. Typically, CVD processes are conducted at the elevated temperatures to accelerate the chemical reaction and to produce high quality films. Some processes, such as epitaxial silicon deposition, are conducted at extremely high temperatures (>900° C.).

To achieve the desired high temperatures, substrates can be heated using resistance heating, induction heating or radiant heating. Among these heating techniques, radiant heating is the most efficient technique and, hence, is the currently favored method for certain types of CVD. Radiant heating involves positioning infrared lamps around a reaction chamber positioned within high-temperature ovens, called reactors. Unfortunately, radiant energy has a tendency to create nonuniform temperature distributions, including "hot spots," due to the use of localized radiant energy sources and consequent focusing and interference effects.

During a CVD process, one or more substrates are placed on a wafer support (i.e., susceptor) inside a chamber defined within the reactor (i.e., the reaction chamber). Both the wafer and the support are heated to a desired temperature. In a typical wafer treatment step, reactant gases are passed over the heated wafer, causing chemical vapor deposition (CVD) of a thin layer of the desired material on the wafer. If the deposited layer has the same crystallographic structure as the underlying silicon wafer, it is called an epitaxial layer. This is also sometimes called a monocrystalline layer because it has only one crystal structure. Through subsequent processes, these layers are made into integrated circuits, producing from tens to thousands or even millions of integrated devices, depending on the size of the wafer and the complexity of the circuits.

Various process parameters must be carefully controlled to ensure a high quality of layers resulting from CVD. One such critical parameter is the temperature of the wafer during each treatment step of wafer processing. During CVD, for example, the wafer temperature dictates the rate of material deposition on the wafer because the deposition gases react at particular temperatures and deposit on the wafer. If the temperature varies across the surface of the wafer, uneven deposition of the film occurs and the physical properties will not be uniform over the wafer. Furthermore, in epitaxial deposition, even slight temperature non-uniformity can result in crystallographic slip.

In the semiconductor industry, it is important that the material be deposited uniformly thick with uniform properties over the wafer. For instance, in Very Large and Ultra Large Scale Integrated Circuit (VLSI and ULSI) technologies, the wafer is divided into individual chips having integrated circuits thereon. If a CVD process step produces deposited layers with nonuniformities, devices at different areas on the chips may have inconsistent operation characteristics or may fail altogether.

SUMMARY OF THE INVENTION

The systems and methods of the present invention have several features, no single one of which are solely responsible for its desirable attributes. Without limiting the scope of this invention as expressed by the claims which follow, its more prominent features will now be discussed briefly. After considering this discussion, and particularly after reading the section entitled "Detailed Description of the Preferred Embodiments," one will understand how the features of this invention provide several advantages over traditional CVD heating methods and systems.

One aspect is a chemical vapor deposition apparatus that comprises a high temperature processing chamber and a susceptor disposed within the chamber for supporting a wafer to be processed, the susceptor comprising a top surface, a bottom surface, and a perimeter. The apparatus further comprises a plurality of light emitting diodes (LEDs) located on a surface of the chamber, each configured to emit radiant energy towards the top surface, and a controller configured to adjust the radiant energy emitted by at least one of the plurality of LEDs relative to another one of the plurality of LEDs.

Another aspect is a method of processing a semiconductor in a chamber by applying heat from an array of LED lamps disposed adjacent to the chamber, each LED lamp being configured to emit directional radiant energy towards a substrate in the chamber. The method comprises inserting a wafer in a chamber, sensing an operational status of a plurality of LED lamps, if an LED from the plurality of LED lamps is non-operational, then adjusting a planned temperature profile for the plurality of LED lamps to compensate for the non-operational LED lamp. The method further includes applying heat from the plurality of LED lamps to the wafer, identifying nonuniformities in the temperature of the wafer, and adjusting an energy level output of at least one of the plurality of LED lamps with respect to another one of the plurality of LED lamps to compensate for the nonuniformity.

Still another aspect is a semiconductor processing apparatus that comprises a chamber defined by at least one wall, a structure, for supporting a substrate within the chamber, and at least one LED heat lamp array disposed proximate to the chamber.

Yet another aspect is an apparatus for processing semiconductor wafers at elevated temperatures that comprises a high temperature processing chamber defined by at least one wall, a susceptor disposed within the chamber for supporting a wafer to be processed, the susceptor comprising a top surface, a bottom surface, a perimeter, a first array of LED heat lamps being disposed proximate to the susceptor, and at least one LED lamp of the first array of LED heat lamps configured to emit directional radiant energy in a first direction towards the top surface. The apparatus further comprises a first perforated reflector located between the first array of LED heat lamps and the susceptor, the perforations being aligned with the at least one LED lamp of the first array and a second array of LED heat lamps being disposed proximate to the susceptor and parallel to the first array of LED heat lamps, the susceptor being disposed between at least a portion of the first array of LED heat lamps and said second array of LED heat lamps. The apparatus still further comprises at least one LED lamp of the second array of LED heat lamps configured to emit directional radiant energy in a second direction towards the bottom surface, both of the directions being at least partially disposed within a volume defined by the susceptor perimeter in a direction normal to the susceptor, and a second perforated reflector located between the second array of LED heat lamps and the susceptor, the perforations being aligned with the at least one LED lamp of the second array.

Another aspect is a chemical vapor deposition apparatus that comprises a process chamber having an area for horizontal positioning of a substrate within a substrate treatment zone and having chamber walls for conducting a flow of gas across a surface of the substrate, a first two-dimensional array of heat lamps being disposed generally above the substrate treatment zone, each LED of the first two-dimensional array of heat lamps having a length and a width so that the first two-dimensional array of heat lamps spans the substrate treatment zone in a first row and spans the substrate treatment zone in a first column generally perpendicular to the first row. The apparatus further comprises a first perforated reflector located between the first two-dimensional array of heat lamps and the substrate, the perforations being substantially aligned with the first two-dimensional array of heat lamps, a second two-dimensional array of heat lamps being disposed generally below said substrate treatment zone, each LED of the second two-dimensional array of heat lamps having a length and a width so that the second two-dimensional array of heat lamps spans the substrate treatment zone in a second row and spans the substrate treatment zone in a second column, at least one LED from the second row or second column having means for adjusting energy lamp output relative to another of the LEDs from the same second row or column, and a second perforated reflector located between the second two-dimensional array of heat lamps and the substrate, the perforations being substantially aligned with the second two-dimensional array of heat lamps.

Still another aspect is a method of processing a substrate in a chamber by applying heat from an LED lamp disposed adjacent to the chamber, the LED lamp being configured to emit directional radiant energy towards the substrate. The method comprises inserting a wafer in a chamber, applying heat from the LED lamp to the wafer, identifying nonuniformities in the temperature of the wafer, and adjusting an energy level output of the LED lamp to compensate for the nonuniformity.

BRIEF DESCRIPTION OF THE DRAWINGS

These and other features, aspects and advantages of the present invention will now be described with reference to the drawings of several preferred embodiments, which embodiments are intended to illustrate and not to limit the invention.

FIG. 1 is a perspective view of one embodiment of a process chamber that can implement light emitting diode lamps having certain features, aspects and advantages of the invention.

FIG. 2 is a cross-sectional view of the chamber of FIG. 1 taken along the line 2—2.

FIG. 3 is a perspective cross-sectional view of one-half of the process chamber of FIG. 1 taken along the line 3—3.

FIG. 4 is a top plan view of the chamber of FIG. 1 with certain internal components being shown with dashed lines.

FIG. 5 is a view of the inlet end of the chamber of FIG. 1 with certain internal components being shown with dashed lines.

FIG. 6 is a view of the outlet end of the chamber of FIG. 1 with certain internal components being shown with dashed lines.

FIG. 7 is a side elevational view of the chamber of FIG. 1 with certain internal components being shown with dashed lines.

FIG. 8 is a cross-sectional view illustrating the chamber connected to a portion of a wafer processing system.

FIG. 9 is a cross-sectional view illustrating a processing system environment that includes an arrangement of radiant LED heat lamps disposed above and below another chamber configuration.

DETAILED DESCRIPTION OF THE PREFERRED EMBODIMENTS

Figure 10:
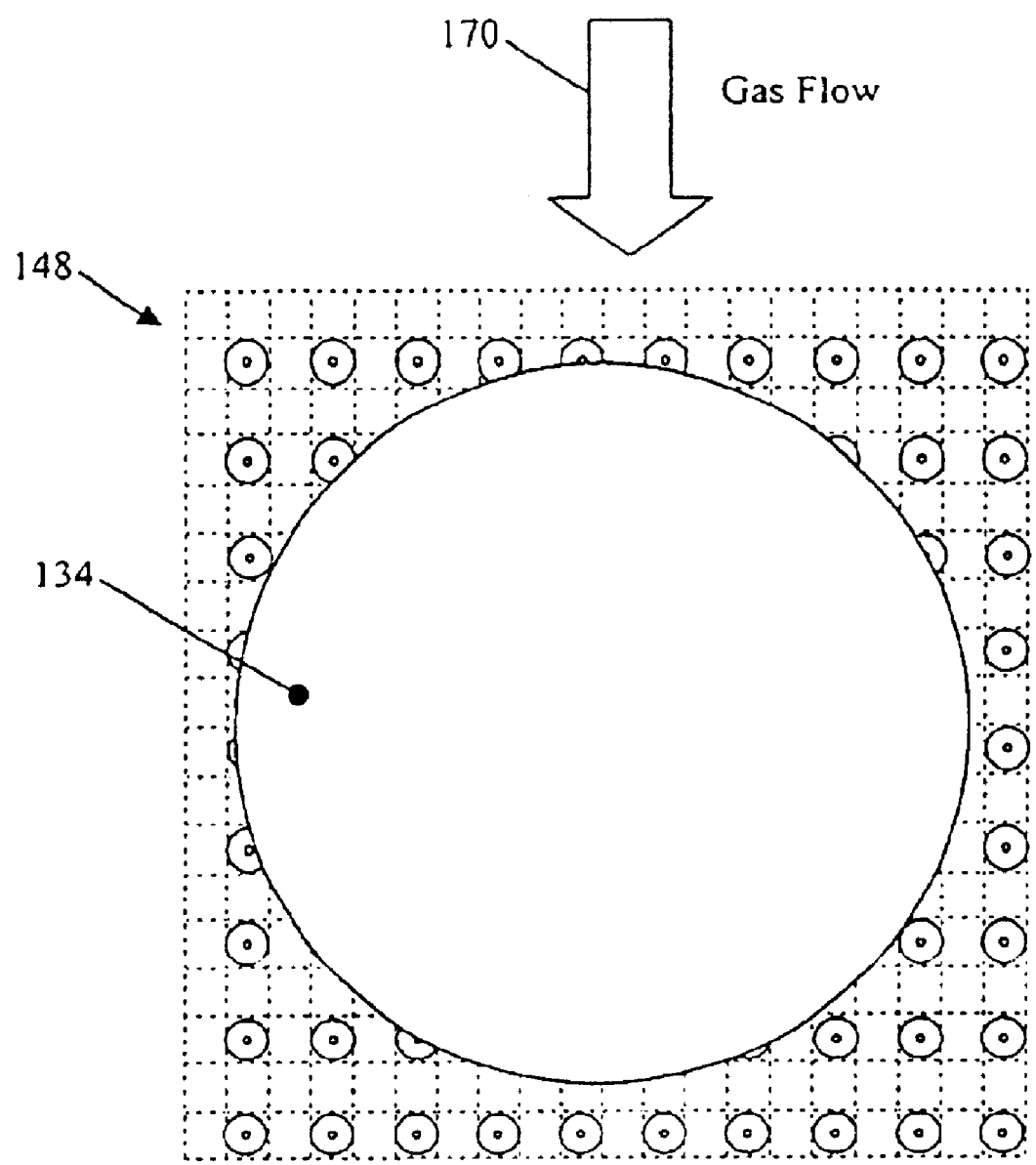
FIG. 10 is a top cross-sectional view of a portion of the chamber of FIG. 9 taken along the line 10—10, illustrating an array of radiant LED heat lamps disposed below an exemplary susceptor.

U.S. Pat. No. 4,836,138, which issued on Jun. 6, 1989 to Robinson et al., and U.S. Pat. No. 4,828,224, which issued on May 9, 1989 to Crabb et al., both of which are hereby expressly incorporated by reference, described exemplary cold-wall single wafer reaction chambers. These reaction chambers are exemplary environments that can be modified according to the teachings of this patent. For example, LED heat lamps and arrays of LED heat lamps can be used in accordance with certain features, aspects and advantages of the present invention. In one preferred arrangement, the LED heat lamps and arrays are used in CVD chambers. In a more preferred arrangement, the LED heat lamps are used in CVD chambers that have been optimized for epitaxial deposition.

U.S. Pat. No. 6,093,252, which issued on Jul. 25, 2000 to Wengert et al., also disclosed a reaction chamber configuration that can be modified to use LED heat lamps and arrays of LED heat lamps having certain features, aspects and advantages in accordance with the present invention. The disclosure of that patent is hereby expressly incorporated by reference.

With reference now to FIGS. 1–8, an exemplary reactor chamber 10 for chemical vapor processing and the like is illustrated. As can be seen, the chamber 10 has an elongated, generally flattened configuration, which in cross section has a generally lenticular shape. A lenticular shape has opposed biconvex surfaces which may have circular curvatures. In some configurations, the chamber can have other outer shapes, such as square, rectangular and the like. For instance, a square chamber is disclosed in U.S. Pat. No. 6,143,079, which issued on Nov. 7, 2000, and which is hereby incorporated by reference in its entirety. The illustrated chamber of FIGS. 1–8 has an upper wall 12 with an outer convex surface and an inner concave surface, and a lower wall 14 with an outer convex surface and an inner concave surface. The walls 12 and 14 are connected by vertically short side rails 16 and 18. These walls and side rails are further joined by an upstream inlet end flange 20 and a downstream outlet end flange 22. Upstream and downstream relate to the direction of process gas flow, as will be described, and are synonymous in the present description with front and rear.

With reference now to FIG. 2, both the upper wall 12 and the lower wall 14 are thin, curved plate-like elements having a rectangular flat vertical projection. The walls 12 and 14 desirably have a circular radius of curvature and may be formed by segments cut from a cylindrical tube made of quartz or similar material. In larger chambers, the walls 12 and 14 may be constructed by heating and forming flat quartz plates. Although quartz is preferred, other materials having similar desirable characteristics may be substituted. Some of these desirable characteristics include a high melting point, the ability to withstand large and rapid temperature changes, chemical inertness, and a high transparency to light.

The thick side rails 16, 18 may be machined from a quartz rod of rectangular cross section or otherwise formed into the cross sectional shape illustrated in FIG. 2. More specifically, each side rail 16, 18 includes a reinforced main body having an upper surface 24 that forms a continuation of the curved exterior surface of the upper wall 12, and a lower surface 26 which is curved to form a continuation of the exterior surface of the lower wall 14. The laterally exterior surface 28 of each side rail 16, 18 is flat and extends vertically. The interior surface of each side rail 16, 18 is formed with longitudinally extending upper and lower recesses 30a, 30b that create upper, middle and lower stub wall segments 32a, 32b, 32c, respectively. The upper and lower stub wall segments 32a, 32c mate with the side edges of the upper and lower walls 12 and 14 at longitudinal weld joints 39. In one embodiment, the main body of the side rails 16, 18 has a thickness or width dimension of about 20 mm and a height of about 21 mm.

In the illustrated arrangement, a support or stringer preferably is provided in the form of a flat, rectangular plate 40 that extends between the side rails 16 and 18. As seen in FIG. 4, the support plate 40 includes an aperture 42 defining a void or opening 44 extending across the width of the chamber 10 and dividing the support plate 40 into an inlet section 46a and an outlet section 46b. The inlet section 46a extends from the inlet flange 20 to an upstream edge of the opening 44, and the outlet section 46b extends from a downstream edge of the opening 44 to the outlet flange 22. As may be seen from FIG. 4, the inlet section 46a of the support plate is shorter in the longitudinal direction than is the outlet section 46b. More specifically, in a preferred arrangement, the inlet section is about 70% of the length of the outlet section. That proportional arrangement generally relates to the process gas flow through the chamber.

As best seen in FIG. 2, each of the side rails 16 and 18 includes the inwardly extending central stub wall 32b that in effect forms an extension of the support plate 40. In this respect, the support plate 40 in practice terminates at the main body of the side rails 16, 18, or, in other words, at the laterally outer extent of the recesses 30a, 30b. Longitudinal joints 48 indicate the welded connection between the lateral edges of the support plate 40 and the central stub walls 32b of each of the side rails 16 and 18. The central stub walls 32b precisely bisect the upper and lower walls 12 and 14, and the support plate 40 thus lies on the exact centerline or center plane therebetween.

With reference to FIGS. 1 and 3, each of the end flanges 20, 22 comprise outer, generally rectangular slabs 50, 51, respectively, having chamfered corners 52 and inner lenticular shaped extensions 54. With reference now to FIGS. 1 and 3, the inner extensions 54 conform to the shapes of the upper and lower walls 12, 14 and the central support plate 40. More particularly, short longitudinal portions extend from the slabs 50, 51 to join with each of these plate-like members 12, 14, 40. At each end of the chamber 10, curvilinear weld joints 56 are formed between the curved upper and lower walls 12, 14 and the upper and lower portions of the extensions 54, while linear joint lines 58 are defined between central portions of the extensions 54 and the longitudinal ends of the support plate 40.

The slab 50 of the inlet flange 20 includes a laterally extending aperture 60 (see FIG. 3) in an upper portion which leads into an upper region 66 (see FIG. 2) within the chamber 10 above the support plate 40 and below the upper wall 12. The slab 51 of the outlet flange 22, in contrast, includes a pair of laterally extending apertures 62, 64 (see FIG. 3); the upper aperture 62 communicates with the upper region 66 (see FIG. 2) of he chamber 10 previously described, while the lower aperture 64 communicates with a lower region 68 (see FIG. 2) of the chamber 10 defined below the support plate 40 and above the lower wall 14. The rounded recesses 30a, 30b in the side rails 16, 18 define lateral boundaries of the upper and lower regions 66, 68. As will be described below, the wafer processing is done in the upper region 66 only, with the support plate 40 defining the lower boundary of the process zone.

The opening 44 in the support plate 40 is dimensioned to receive a susceptor 70, as illustrated in FIGS. 3 and 8, and a temperature compensation ring 72 (see FIGS. 4 and 8), which surrounds the susceptor 70. The temperature compensation ring 72 has a thermal mass configured to help increase temperature uniformity in the chamber. In one configuration, the ring itself is asymmetric relative to a wafer being processed, such that the ring has a different center of thermal mass than the wafer or an uneven distribution of thermal mass about the wafer. For instance, in one arrangement, the ring can have a substantially rectangular outer perimeter that results in high thermal mass concentrations at the corners but a similar center of thermal mass relative to the wafer. In other arrangements, the ring can have an off-center configuration (e.g., the illustrated elongated rectangle) in which the distribution of thermal mass about the wafer is uneven. For instance, the ring can receive the wafer in a location other than its center. Of course, the ring can be triangular, circular, elliptical, or any other suitable shape, depending in part upon the geometry of other features in the chamber and the gas flow path.

The susceptor 70 is adapted to rotate within the stationary ring 72 and is preferably spaced therefrom across a small annular gap G of about 0.5 to 1.0 mm. The centerline of a generally circular temperature compensation ring 72 is schematically illustrated in FIG. 4 by the broken line circle 74 shown therein. The shape of the aperture 42 in the support plate 40 surrounding the ring 72 can also be made circular so that the edges of the opening 44 would be in close proximity to the ring. However, it has been found that somewhat of a rectangular aperture 42 having rounded corners, as shown in FIG. 4, is preferred. The support plate sections 46a, 46b may be cut to provide those exact shapes; or for manufacturing convenience, short, somewhat triangular sections 76 of fill, shown in FIG. 4, may be welded to the plate sections and the chamber side rails 16, 18 to provide the desired configuration.

It will be noted that the circle 74 shown in FIG. 4, which represents the centerline of the temperature compensation ring 72 (see FIG. 8), is neither centrally positioned with respect to the upstream and downstream ends of the chamber, nor with respect to opening 44. Instead, the upstream or leading edge of the circle 74 is closer to the downstream edge of the inlet plate section 46a than is the downstream or trailing edge of the circle to the upstream edge of the outlet plate section 46b. This arrangement helps maintain the strength of the chamber by reducing the rate of devitrification of the upstream edge of the outlet plate section 46b. That is, the gas flow heats up as it passes over the susceptor so that the temperature in the chamber walls tends to be the greatest just downstream from the susceptor. The upstream edge can therefore be exposed to significant thermal cycling and devitrification if too close to the susceptor, and thus the susceptor is offset forwardly within the opening 44 to increase the spacing therebetween.

In some configurations, the offset arrangement discussed directly above also affects the flow of the process gases through the chamber. More particularly, the wafer placed upon the susceptor which is surrounded by the ring is positioned close to the downstream edge of the inlet plate section 46a to minimize the amount of reaction gases which pass through the opening 44 upstream of the wafer. This minimizes the amount of reaction gas which can deposit underneath the susceptor in the lower portion 68 of the chamber 10. It also should be noted that this configuration increases the difficulty in obtaining a uniform temperature region proximate the wafer.

With continued reference to FIGS. 4 and 8, the temperature compensation ring 72 is supported by three elbow-shaped support elements having vertically extending portions being welded to the support plate sections. More specifically, a front support element or finger 80 is welded to the rear of the front plate section 46a midway between the rails 16, 18 of the chamber, and the horizontal portion of the finger or element 80 extends rearwardly into the opening 44 so as to be positioned under the leading edge of the temperature compensation ring 72. A pair of spaced elements or fingers 82 have elongated horizontal portions that extend forwardly beneath the trailing edge of the compensation ring 72 as seen in FIG. 8, as well as FIGS. 2–7. Preferably, each of the fingers or elements 80, 82 includes a pin (not shown) that underlies the compensation ring 72. The compensation ring 72 is thus supported in a horizontal plane at three points by upstanding pins (not shown) in the fingers or elements 80, 82. The pins may eventually deteriorate from repeated thermal cycling and exposure to process etch gases, but they can be replaced fairly readily.

In FIG. 8, a susceptor 70 is shown supported on arms 86 of a suitable support 88 connected to the upper end of a rotatable shaft 90 that extends through a tube 92 depending from the bottom wall of the chamber. The susceptor 70 is shown approximately level with the upper edge of the ring 72 and with the upper surface of the support plate 40. This enables a wafer to be positioned above the susceptor 70 and in the upper portion 66 of the process chamber 10.

Still referring to FIG. 8, the inlet flange 20 is adapted to be connected to an inlet component 94 having a horizontally elongated slot 96 through which a wafer may be inserted, and having an elongated inlet 98 for introducing process gas into the upper portion 66 of the chamber after an isolation valve leading from the slot 96 to a wafer handling chamber (not shown) has been closed. Correspondingly, the outlet flange 22 is adapted to mate with an outlet component 100 for exhausting process gas 112 from the chamber 10, as well as applying a vacuum to the chamber. As can be seen from FIG. 8, the outlet flange 22 is open to the lower portion 68 of the chamber beneath the support plate as well as the portion 66 above the support plate.

A plurality of temperature sensing devices, for example, thermocouples 102, extends through the outlet component 100 and into the lower portion 68 of the process chamber. The thermocouples 102 extend into proximity of the susceptor 70 to sense the local temperature surrounding the susceptor 70 and wafer positioned there above. As has been described previously in U.S. Pat. No. 6,093,252, the advantageous positioning of the sensing ends of the thermocouples 102 surrounding the susceptor 70 allows comprehensive feedback regarding the temperature of the wafer and enables adjustment of radiant light emitting diode (LED) heat lamp arrays 108, which will be described later, to compensate for temperature irregularities. More particularly, a leading edge thermocouple 104 terminates proximate the front end of the susceptor 70, a trailing edge thermocouple 106 terminates proximate a rear edge of the susceptor and a lateral thermocouple (not shown) terminates proximate a lateral edge of the susceptor. Each of the thermocouples 102 enters the temperature compensation ring 72 which is formed of two parts to provide a hollow interior therein. Again, this ring has been described previously in U.S. Pat. No. 6,093,252, which is hereby expressly incorporated by reference.

Preferably, the temperature compensation ring 72 is constructed of graphite or other such high heat absorbency material. The ring 72 provides several advantages in the processing environment, primarily reducing edge heat losses from the susceptor 70. More specifically, the ring 72 closely surrounds the edge of the susceptor 70 and is maintained at a similar temperature during processing, as the materials are similar. The susceptor and ring thus radiate heat toward one another to greatly reduce any radiant losses therebetween. Another advantage of the temperature compensation ring 72 is preheating and postheating of the reactant gas in the region of the wafer. Specifically, the reactant gas enters the chamber at an ambient, non-reacting temperature and is heated to a temperature suitable for deposition as it passes over the susceptor and wafer. The surrounding temperature compensation ring 72 thus preheats the reactant gas stream before it reaches the leading edge of the susceptor, and, subsequently, the leading edge of the wafer. The process gas thus reaches an approximately steady state temperature before traveling over the edge of the wafer. Additionally, the temperature of the gas does not significantly drop off after passing the downstream edge of the wafer as the temperature compensation ring 72 extends the downstream heating region. In some arrangements, the ring may be elongated in a downstream direction such that the temperature drop occurs further downstream from the wafer.

The gas flow through the chamber is shown in FIG. 8. Reactant gas enters through the inlet component 94 with a predetermined lateral velocity profile, such as the profile described in U.S. Pat. No. 5,221,556, the entirety of which is hereby expressly incorporated by reference. The predetermined velocity profile provides a larger gas flow towards the central portion of the reaction chamber 10 than the laterally outer edges to compensate for the longer deposition travel path over the center of the circular wafer supported on the susceptor 70. In other words, a greater amount of reactant gas is provided over the central portion of the wafer due to reactant depletion along that flow path over the wafer.

The reactant gas continues longitudinally rearward as indicated by arrow 112 and exits through the outlet component 100 and downward through exhaust conduits 114, as indicated with arrow 116. Typically, purge gas is supplied upward through the hollow tube 92 surrounding the shaft 90, the tube being sized to provide a gas passage surrounding the shaft. The purge gas enters the lower portion 68 of the chamber 10 as indicated by arrows 118. The purge gas prevents unwanted deposition of particulates underneath the susceptor 70 and exits through the lower longitudinal aperture 64 in the outlet flange 22, as indicated by arrow 120. The purge gas then mixes with the spent reaction gas and continues down along the path of arrow 116 through the exhaust conduits 114.

With reference again to FIGS. 1–7, the end flanges 20, 22 are preferably translucent and fabricated from quartz having nitrogen bubbles dispersed therein. The central thin walls 12, 14 and support plate 40, on the other hand, are transparent to radiant energy, allowing radiant heating of the susceptor and wafer in the chamber 10, without creating high temperatures in these structures. The translucent flanges 20, 22 scatter radiant energy to reduce "light-piping" therethrough. This protects O-rings 122 outside of the flanges 20, 22 from exposure to extreme temperatures generated within the chamber 10. Preferably, a section of the tube 92 below the lower wall 14 is similarly translucent from nitrogen bubbles dispersed therein.

FIG. 9 illustrates a particular arrangement of components surrounding a reaction chamber 130 that can be used for CVD processing. Reaction chamber 130 is similar to the chamber 10 described with reference to FIGS. 1–8. The chamber 130 includes an inner support plate 132 which is similar to the inner support plate 40 as previously described, and thus includes an aperture 133 formed therein. The aperture 133 is sized to receive a temperature compensation ring 155 and a susceptor 134 for supporting a semiconductor wafer. The support plate 132 is divided into a front section 135a upstream of the aperture 133 and a rear section 135b downstream of the aperture 133. The susceptor 134 is positioned on a plurality of radially extending arms 136 of a central hub 138 mounted on a hollow shaft 140. The shaft 140, in turn, is rotated by a motor 142 disposed below the chamber 130. The rotational coupling between the motor 142 and the shaft 140 is explicitly described in U.S. Pat. No. 6,093,252, previously incorporated by reference. The motor 142 preferably is mounted on a fixed frame and includes adjustment mechanisms for properly positioning the susceptor 134 within the chamber 130.

At least one LED heat lamp array is arranged around the reaction chamber 130 to heat the susceptor 134 and any wafer thereon. A first array of upper LED lamps 146 is arranged above the chamber 130. A second lower array of LED lamps 148 is arranged below the chamber 130. In another embodiment, the at least one LED heat lamp array comprises a single LED lamp configured to heat the susceptor 134 and the wafer.

The second lower array of LED lamps 148 may or may not be aligned with the first array of upper LED lamps 146. The distribution of the upper array of LED lamps 146 is unimpeded so that a regular sequence of LED lamps is provided across the surface of the chamber 130. The lower array of LED lamps 140, on the other hand, is provided across the surface of the chamber 130 except in the region of the shaft 140. Thus, one or more spot lights or directed lamps 150 are positioned under the chamber 130 and surround a downwardly extending quartz tube 152 formed integrally with the chamber 130. The tube 152 concentrically receives the shaft 140. The tube 152 and shaft 140 create an annular space therebetween which is used to inject a purge gas into a region underneath the susceptor 134. The directed lamps 150 radiate energy to the underside of the susceptor 134, which may be shadowed by the shaft 152 and supporting structure. The specific heating arrangement for the directed lamps 150 is similar to that described and illustrated in U.S. Pat. No. 4,836,138, which is hereby expressly incorporated by reference.

The upper and lower arrays of LED lamps 146, 148 are distributed in a generally rectangular configuration above and below, respectively, the susceptor region 134. This arrangement, in combination with the directed lamps 150, focuses the radiant energy on the susceptor 134 and the associated wafer. Different arrangements and locations of the upper and lower arrays of LED lamps can be used. For example, the upper and/or lower arrays of LED lamps could be arranged in a concave fashion.

The orientation of the upper and lower arrays of LED lamps 146, 148 with respect to one another further enhances uniformity of heating of the susceptor 134. Generally, the LED lamps 146, 148 can receive the same power levels or receive differing power levels to account for end effects and other phenomena that can vary the temperature gradient across the wafer. A configuration for supplying the differing power levels to the LED lamps 146, 148 is described with reference to FIG. 13.

An enlarged temperature compensation ring 155 is shown in FIG. 9. It should be noted, however, that the peripheral shape of the modified temperature compensation ring 155 is generally rectangular and the shape generally conforms to the radiant heat from the upper and lower arrays of LED lamps 146, 148. This arrangement is highly efficient and results in more uniform temperatures across the susceptor 134.

With reference now to FIG. 10, a typical grid of LED heat lamps, which is fashioned from the bottom array of LED lamps 148, is illustrated therein. During processing, a wafer (not shown) is located on the susceptor 134 and within the chamber 130. The wafer rests on the susceptor 134 and is positioned generally above the bottom array of LED lamps 148. The reactant gas flow direction 170 through the chamber 130 is also shown. It should be noted that, in some chambers, the top array and the bottom array can be constructed differently.

Figure 11:
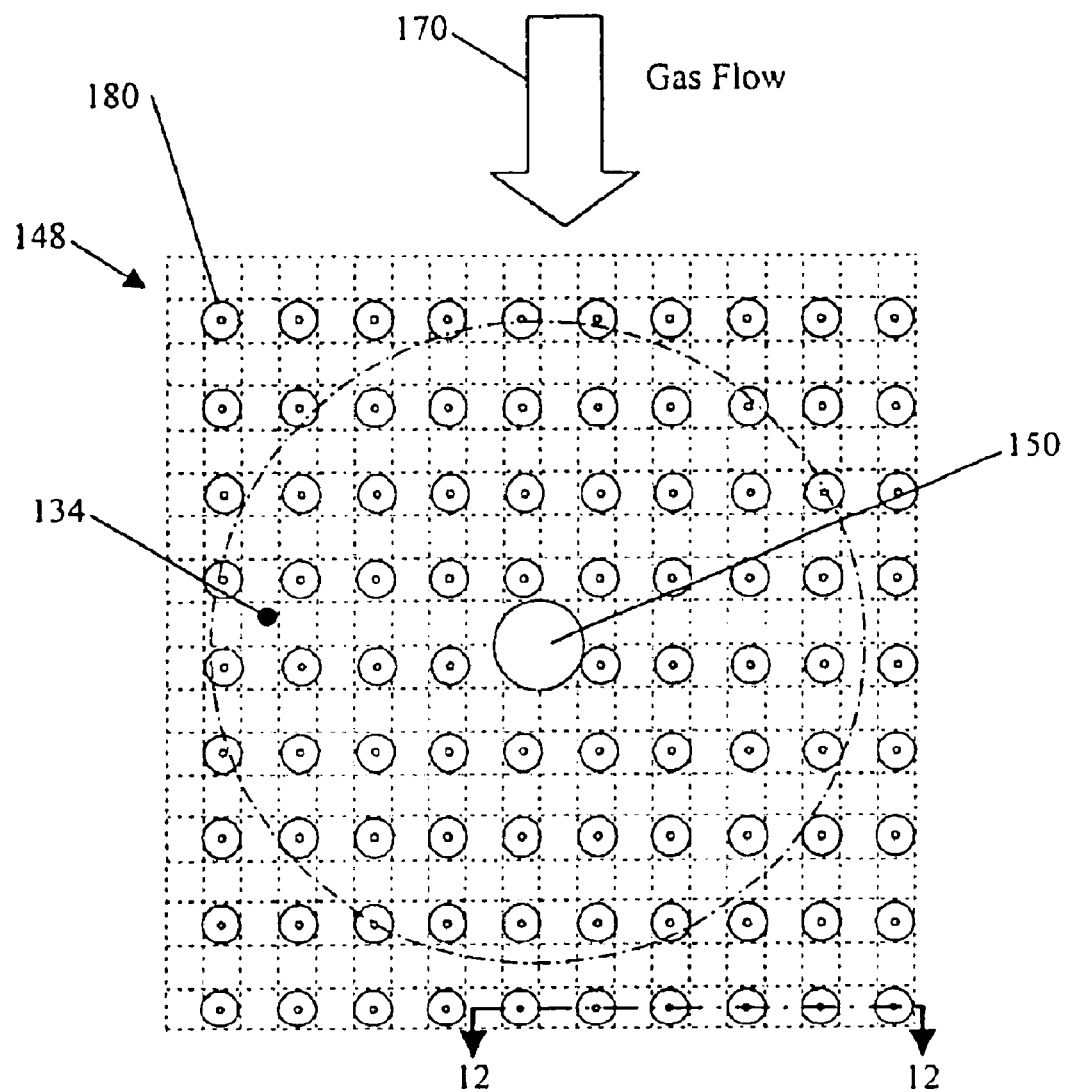
FIG. 11 is the same view as FIG. 10 except that the susceptor is shown in ghost.

With reference now to FIG. 11, the grid shown in FIG. 10 is illustrated with the susceptor 134 shown by dashed lines. The bottom array of LED lamps 148 includes light emitting diode (LED) lamps 180. The LED lamps 180 are located below the susceptor and are spread across the grid. In this arrangement, the bottom array 148 also accommodates the spot lamps 150, the rotating shaft 140 and the gas supply tube 152 (see FIG. 9). Thus, the central region of the bottom array of LED lamps 148 does not admit to full LED lamps 180 across its entire surface. To the contrary, in such a configuration, the top array of LED lamps 146 (see FIG. 9) would not have such obstructions and full LED lamps across its entire surface are easily accommodated and implemented.

With continued reference to FIG. 11, in one arrangement of the grid, the arrays of LED lamps are rectangular and approximately ninety LED lamps make up the bottom array of LED lamps. The top array of LED lamps 146 (see FIG. 9) may include a similar number of LED lamps. In another rectangular embodiment, each square inch of the grid comprises twenty-five LED lamps. Continuing with this embodiment, if the grid area is sixteen inches by sixteen inches, then twenty-five LED lamps×256 square inches ~6,400 LED lamps would be located in the bottom grid. In an alternate arrangement of the grid, the LED lamps are circular in their arrangement with the LEDs arranged in concentric circles. It should be noted that other numbers of LED lamps can be used in the selected arrangement.

Moreover, the number of LED lamps in the top grid can be different than the number of LED lamps in the bottom grid.

A plurality of the LED lamps from the top or bottom grid can be physically grouped so as to facilitate their removal and replacement within their respective grid. In one embodiment, the number of LED lamps in a group ranges from fifty to two hundred and fifty. These groups can be configured as a module that plugs into an underlying base. The base provides electrical contacts.

The LED lamps 180, individually or in groups, advantageously reduce temperature gradients within the chamber such that nonuniformities in temperature across a wafer can be reduced or eliminated. To that end, nonuniformities in temperature within the chamber or nonuniformities across the wafer processed within the chamber can be measured or estimated to determine relative cold spots or hot spots. Once a nonuniformity has been found, one or more of the LED lamps within the arrays can be adjusted to provide differential power output across a region of the array. The temperature gradient within the chamber and, therefore across the wafer, can be greatly reduced and the uniformity of the product can be improved. It should be noted that temperature nonuniformities can be determined in any suitable manner, including but not limited to, direct temperature measurements of the wafer, indirect temperature measurements (i.e., measuring temperature within the chamber) or measuring the thickness of the processed materials.

In one embodiment, the LED lamps 180 operate in response to pre-programming. In this embodiment, the LED lamps vary their heat output over time based on the pre-programming. In another embodiment, a failure of one or more LED lamps 180 is detected and compensated for by operational LED lamps 180.

Figure 12:
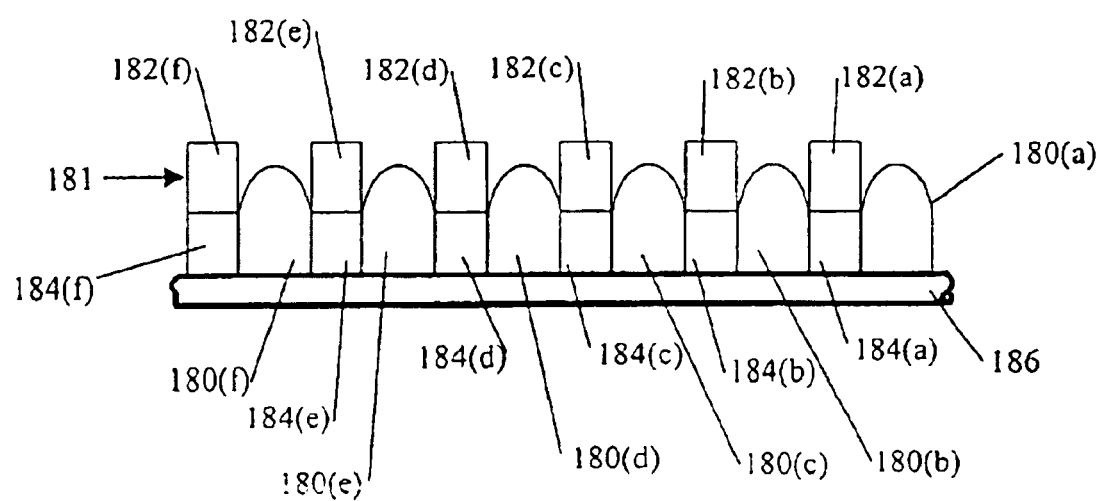
FIG. 12 is a detailed cross-section view of a portion of one row of LED heat lamps from FIG. 11 taken along the line 12—12.

With reference to FIG. 12, a cross-sectional drawing of a portion of the array 148 with one arrangement of a row of LED lamps is shown. The row comprises LED lamps 180(a)–180(f) covered by a perforated reflector layer 181. The perforated reflector layer 181 is coupled to supports 184(a)–(f). The supports 184(a)–(f) and the LED lamps 180(a)–(f) are both coupled to a printed circuit board 186.

In one embodiment, the LED lamps 180(a)–180(f) include gallium aluminum arsenide (GaAlA) infrared emitting diodes enclosed in a transparent plastic case. For example, types OP290, OP291, and OP292 of diodes manufactured by Optek Technology, Inc. of Carrollton, Tex. can be used. Each LED lamp 180 is positioned to emit electromagnetic radiation in a focussed beam towards the susceptor 134 (see FIG. 11). Each LED lamp 180 generally comprises two connectors, an anode and a cathode (not shown), disposed at the interface with the PCB 186. The two connectors extend into the LED lamp 180 and are electrically connected to a diode located therein. Thus, when a power is applied across the two connectors, the diode provides a source of radiant energy from its distal end in a manner generally known to those of ordinary skill in the art. LED Lamps 180(a)–(f) can have varied dimensions depending upon the application and size desired.

The perforated reflector layer 181 is formed of a reflective material with perforations or apertures 182(a)–(f) formed therein. The apertures 182(a)–(f) substantially align with the LED lamps 180(a)–(f) to permit the electromagnetic radiation emitted by the LED lamps 180(a)–(f) to pass through the reflector layer 181. The shape of the apertures 182(a)–(f) can be selected to compliment the irradiance pattern of the LED lamps. For example, a round shape can be selected for embodiments where each of the LED lamps 180(a)–(f) emits electromagnetic radiation along a cylindrical path towards the susceptor. Other aperture shapes can also be used. The apertures 182(a)–(f) can be sized so as to reduce the reflected electromagnetic radiation that impinges upon the LED lamps 180(a)–(f). In this way, the reflector layer 181 reflects electromagnetic radiation that was reflected towards the LED lamps 180(a)–(f). The reflector layer 181 can comprise, for example, a metallic surface such as gold.

The perforated reflector layer 181 attaches to the supports 184(a)–(f). The supports 184(a)–(f) provide a barrier between adjacent LED lamps 180(a)–(f). The supports comprise a metallic material, for example, aluminum. Alternatively, steel can be used.

The printed circuit board (PCB) 186 is well known in the art and provides an electrical and mechanical interface for the LED lamps 180(a)–(f). The PCB 186 also provides the interface to electronic heater control circuitry, described with reference to FIG. 13. The PCB 186 further provides an attachment surface for the supports 184(a)–(f). Depending on the arrangement and grouping of the LED lamps, one or more PCBs may be used to attach one or LED lamps thereto.

Figure 13:
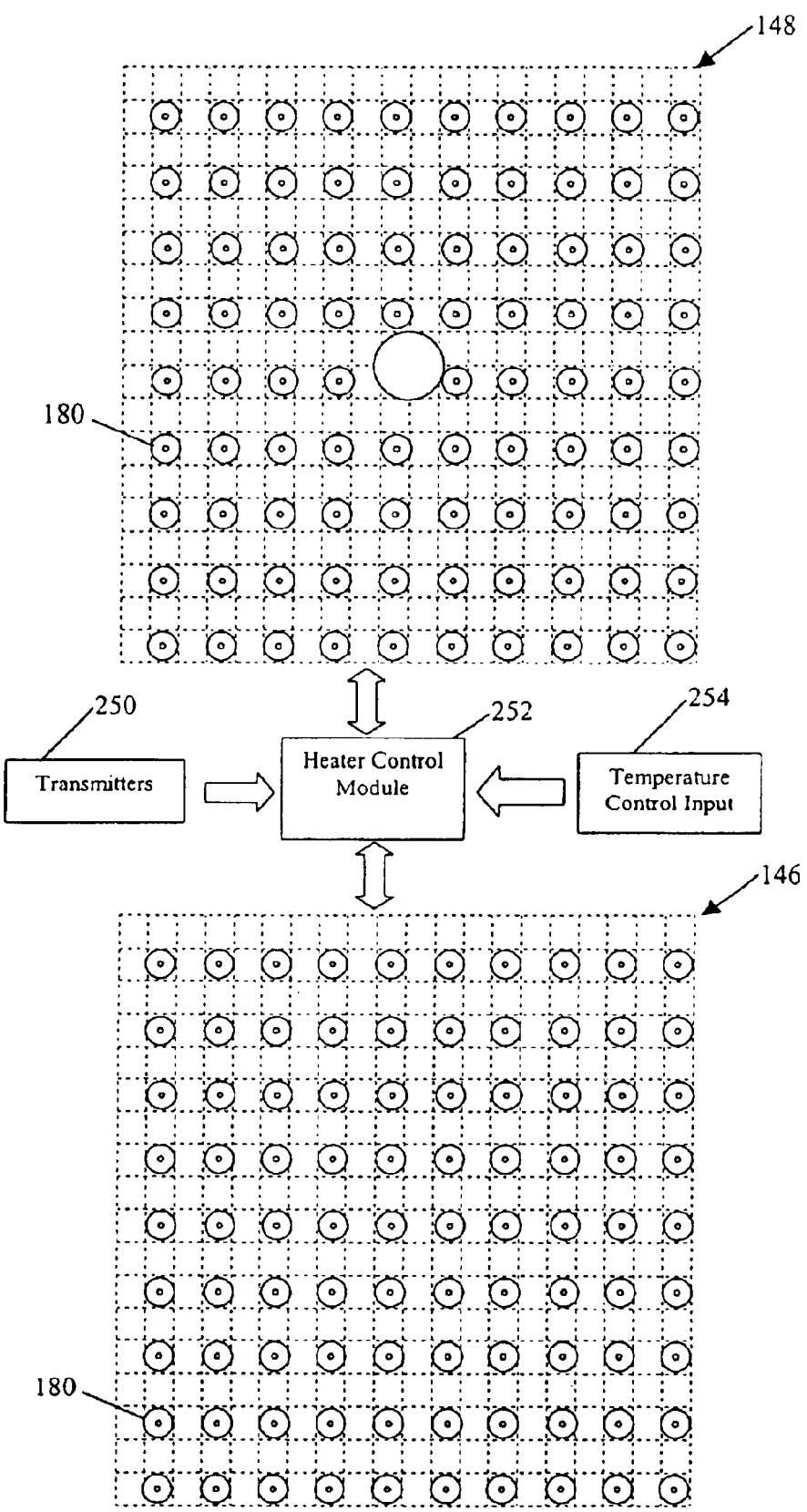
FIG. 13 is a schematic view of the heating system of the present invention and also shows electrical connections to a suitable heater control module.

FIG. 13 is a schematic view of the heating system of the present invention and also shows electrical connections between a suitable control circuit. The heating system comprises an upper array of LED lamps 146, a lower array of LED lamps 148, transmitters 250, a heater control module 252, and a temperature control input 254.

The upper and lower arrays of LED lamps, individually or in groups, electrically connect with the heater control module 252 via one or more printed circuit boards (PCB) 186. In one embodiment, the heater control module receives one or more signal from the transmitters 250. These signals can represent the temperatures that are measured by the thermocouples 102. The heater control module 252 can further receive signals in the form of temperature settings from the temperature control input 254. These temperature settings can be indicative of a temperature profile programmed for the operation of the chamber. Alternatively, the desired temperature profile is directly programmed into the heater control module 252. In another embodiment, the heater control module 252 receives a signal from the upper and lower arrays of LED lamps 146, 148 indicating that one or more LED lamps are not operating properly. This signal can identify, for example, a failed LED lamp, a misaligned LED lamp, and an LED lamp that is performing out of specification.

In response to one, or more than one, of these various input signals, the heater control module 252 sends control signals to each LED lamp 180 or groups of LED lamps. The control signals allow the heater control module 252 to dynamically control the output of the LED lamps. In this way, the heater control module 252 can, for example, compensate for a failed LED, vary the output of the LED lamps over time based on a program, and adjust the output of the LED lamps based on feedback from the chamber.

Each LED lamp in the upper or lower arrays of LED lamps can be operated at different power levels by control signals produced by the heater control module 252. Besides individual control, each lamp can be controlled in groups. The groups of LED lamps controlled by the heater control module 252 can comprise only LED lamps from the top or bottom arrays of LED lamps. In one embodiment, the groups of LED lamps comprise LED lamps from both of the top and bottom arrays of LED lamps.

In the illustrated arrangement of FIG. 13, ninety individual LED lamps are provided in the top array and eightynine individual LED lamps are provided in the bottom array. The LED lamps receive differing levels of power such that the temperature gradient across the wafer can be substantially uniform across all portions of the wafer surface. Each LED lamp can be associated with a temperature control module based on feedback from temperature sensors (e.g., the thermocouples 102, 104, 106 of FIG. 8).

The LED heat lamps 180(a)–(f) have their connector ends connected with the PCB 186. The LED heat lamps 180(a)–(f) are thus controlled individually or as a group by the output signals from the heater control module 252. The LED heat lamps 180(a)–(f) are presented as an example to illustrate how one or more LED lamps can be controlled by the heater control module 252. As described above, the other LED lamps 180 in the upper and lower arrays of LEDs can be similarly controlled, individually or in groups, by the heater control module 252.

The directed lamps 150 (see FIG. 9) have their respective terminals coupled by conductors (not shown) which are in turn coupled to receive the control signals from the heater control module 252. Thus, each of the directed lamps 150 operates in unison to provide a concentrated heat energy receiving zone at the center area of the susceptor 134.

When an input signal is received from the temperature control input 254 to indicate the start of a deposition cycle, the heater control module 252 responds by applying full power to the directed lamps 150, to the selected LED lamps 180 of the upper array of LED lamps 146, and to the selected LED lamps 180 of the lower array of LED lamps 148. That same input signal contains information indicative of a desired operating temperature at which the deposition cycle is to be accomplished. The application of full power to the directed lamps 150 and to the selected LED lamps of the upper and lower arrays of LED lamps 146, 148 produces a rapid rise in the temperature in the central area of the susceptor 134, and of course, in the central area of the wafer being processed. A master temperature sensor (not shown) located within the shaft 152 senses the rapid rise in temperature and sends signals indicative thereof to the electronic heater control circuitry 152. The electronic heater control circuitry 152 compares the sensed temperature with the desired operating temperature and adjusts the power supplied to the directed lamps 150 and the selected LED lamps of the upper and lower arrays of LED lamps to produce and maintain the desired operating temperature in the central area of the susceptor 134 and wafer.

While the temperature in the central areas of the susceptor 134 and the wafer are being brought up to the desired operating temperature, the temperatures about the periphery of the susceptor 134 and in the temperature compensation ring 72 are simultaneously being brought up to temperature by the selected LED lamps of the upper and lower arrays of LED lamps. The increasing temperatures in the peripherally located heating zones or regions are sensed by the thermocouples 104 and additional sensors if desired. The thermocouples produce signals indicative of the sensed temperatures to the transmitters 250. The transmitters 250 provide these signals to the heater control module 252. The signals received by the heater control module 252 from the transmitters 250 are compared with the signal received from the master temperature sensor to adjust the power to the selected LED lamps to bring the temperatures in the peripherally located heating zones into alignment with the temperature in the central area of the susceptor 134 and the wafer.

Due to variables such as heat losses at the peripheral edges of the wafer and the susceptor 134, the flow of reactant gas through the chamber 10, and the like, the LED heating lamps 180 may be ideally set to normally operate at temperatures which are offset, i.e. different than the desired operating temperature in the central area of the wafer and the susceptor 134. And, the process of sensing temperatures and adjusting the power applied to the various groups, or banks of LED heating elements as needed, is continued throughout the deposition cycle. The object of all this is, of course to provide a uniform, or flat temperature gradient in all of the relevant areas of the substrate, susceptor and temperature compensation ring throughout the deposition cycles. And in the interests of production time, to bring the system up to temperature as fast as possible at the beginning of a cycle and cool it down when a cycle is completed. The rapid increasing of temperatures at the beginning of a cycle, as described above, is accomplished by the directed lamps 150 and selected LED lamps of the upper and lower arrays of LED lamps 146, 148 in combination with the master-slave temperature sensor arrangement which effectively produced the temperature following mode of operation. Cooling the system down at the end of a cycle is accomplished by reversing the above heating-up procedure. In other words, the power applied to the directed lamps 150 and the selected LED heating lamps proximate the center of the upper and lower arrays of LED lamps is reduced and the temperature in the peripherally located heating region will follow along with the reduction of heat at the center areas of the wafer and the susceptor 134.

The term "module," as used herein, means, but is not limited to, a software or hardware component, such as a processor, FPGA, or ASIC, which performs certain tasks. A module may advantageously be configured to reside on the addressable storage medium and configured to execute on one or more processors. Thus, a module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and modules may be combined into fewer components and modules or further separated into additional components and modules. Additionally, the components and modules may advantageously be implemented to execute on one or more computers.

Although the present invention has been described in terms of a certain preferred embodiments, other embodiments apparent to those of ordinary skill in the art also are within the scope of this invention. Thus, various changes and modifications may be made without departing from the spirit and scope of the invention. For instance, various components may be repositioned as desired. Moreover, not all of the features, aspects and advantages are necessarily required to practice the present invention.

I claim:

1. A chemical vapor deposition apparatus comprising:
   a high temperature processing chamber;
   a susceptor disposed within the chamber for supporting a wafer to be processed, the susceptor comprising a top surface, a bottom surface, and a perimeter;
   a plurality of light emitting diodes (LEDs) located on a surface of the chamber, each configured to emit radiant energy towards the top surface;
   a controller configured to adjust the radiant energy emitted by at least one of the plurality of LEDs relative to another one of the plurality of LEDs; and a reflector located between the plurality of LEDs and the susceptor, the reflector comprising perforations aligned with the plurality of LEDs.

2. The apparatus of claim 1, further comprising a temperature sensor configured to generate a signal indicative of a temperature on the top surface.

3. The apparatus of claim 2 further comprising a support plate that defines an opening that is asymmetric relative to the susceptor.

4. The apparatus of claim 3, further comprising a temperature compensation ring surrounding the susceptor within the opening.

5. The apparatus of claim 4, wherein the opening has a generally rectangular shape.

6. The apparatus of claim 5, wherein the plurality of LEDs comprises approximately 6,400 LED lamps.

7. The apparatus of claim 6, wherein the 6,400 LED lamps receive 6,400 different levels of input power.

8. The apparatus of claim 2, wherein the controller is configured to respond to a failure by at least one of the plurality of LEDs.

9. The apparatus of claim 2, wherein the controller is configured to respond to the signal indicative of a temperature.

10. The apparatus of claim 2, wherein the controller is configured to respond to preprogramming.

11. A method of processing a semiconductor in a chamber by applying heat from an array of LED lamps disposed adjacent to the chamber, each LED lamp being configured to emit directional radiant energy towards a substrate in the chamber, the method comprising:
inserting a wafer in a chamber;
sensing an operational status of a plurality of LED lamps;
if an LED from the plurality of LED lamps is non-operational, then adjusting a planned temperature profile for the plurality of LED lamps to compensate for the non-operational LED lamp;
applying heat from the plurality of LED lamps to the wafer;
identifying nonuniformities in the temperature of the wafer; and
adjusting an energy level output of at least one of the plurality of LED lamps with respect to another one of the plurality of LED lamps to compensate for the nonuniformity.

12. A semiconductor processing apparatus comprising:
a chamber defined by at least one wall;
a structure for supporting a substrate within the chamber;
at least one LED heat lamp array disposed proximate to the chamber, wherein the at least one LED heat lamp array comprises a first LED heat lamp and a second LED heat lamp, the first LED heat lamp being configured to emit directional radiant energy towards a first location on the substrate and the second LED heat lamp being configured to emit directional radiant energy towards a second location on the substrate, the first location being different than the second location; and
a controller configured to individually control the radiant energy emitted by the at least one LED heat lamp array, wherein the controller is configured to respond to a failure by the first and second LED heat lamps.

13. A semiconductor processing apparatus comprising:
a chamber defined by at least one wall;
a structure for supporting a substrate within the chamber;
at least one LED heat lamp array disposed proximate to the chamber, wherein the at least one LED heat lamp array comprises a first LED heat lamp and a second LED heat lamp, the first LED heat lamp being configured to emit directional radiant energy towards a first location on the substrate and the second LED heat lamp being conifigured to emit directional radiant energy towards a second location on the substrate, the first location being different than the second location; and
a controller configured to individually control the radiant energy emitted by the at least one LED heat lamp array, wherein the controller is configured to respond to preprogramming.

14. A semiconductor processing apparatus comprising:
a chamber defined by at least one wall;
a structure for supporting a substrate within the chamber;
at least one LED heat lamp array disposed proximate to the chamber, wherein the at least one LED heat lamp array comprises a first LED heat lamp and a second LED heat lamp, the first LED heat lamp being configured to emit directional radiant energy towards a first location on the substrate and the second LED heat lamp being configured to emit directional radiant energy towards a second location on the substrate, the first location being different than the second location;
a controller configured to individually control the radiant energy emitted by the at least one LED heat lamp array; and
a perforated reflector located between the at least one LED heat lamp array and the substrate, the perforations being substantially aligned with the at least one LED heat lamp array.

15. A semiconductor processing apparatus comprising:
a chamber defined by at least one wall;
a structure for supporting a substrate within the chamber;
at least one LED heat lamp array disposed proximate to the chamber, wherein the at least one LED heat lamp array comprises a first LED heat lamp and a second LED heat lamp, the first LED heat lamp being configured to emit directional radiant energy towards a first location on the substrate and the second LED heat lamp being configured to emit directional radiant energy towards a second location on the substrate, the first location being different than the second location;
a controller configured to individually control the radiant energy emitted by the at least one LED heat lamp array; and
a support plate that defines an opening that is asymmetric relative to the susceptor.

16. The apparatus of claim 15, further comprising a temperature compensation ring surrounding the susceptor within the opening.

17. The apparatus of claim 16, wherein the opening has a generally rectangular shape.

18. The apparatus of claim 17, wherein the first LED lamp and the second LED heat lamp receive different levels of input power from the controller.

19. An apparatus for processing semiconductor wafers at elevated temperatures, said apparatus comprising:
a high temperature processing chamber defined by at least one wall;
a susceptor disposed within the chamber for supporting a wafer to be processed, the susceptor comprising a top surface, a bottom surface, a perimeter;
a first array of LED heat lamps being disposed proximate to the susceptor;
at least one LED lamp of the first array of LED heat lamps configured to emit directional radiant energy in a first direction towards the top surface;

a first perforated reflector located between the first array of LED heat lamps and the susceptor, the perforations being aligned with the at least one LED lamp of the first array;

a second array of LED heat lamps being disposed proximate to the susceptor and parallel to the first array of LED heat lamps, the susceptor being disposed between at least a portion of the first array of LED heat lamps and said second array of LED heat lamps;

at least one LED lamp of the second array of LED heat lamps configured to emit directional radiant energy in a second direction towards the bottom surface, both of the directions being at least partially disposed within a volume defined by the susceptor perimeter in a direction normal to the susceptor; and a second perforated reflector located between the second array of LED heat lamps and the susceptor, the perforations being aligned with the at least one LED lamp of the second array.

20. The apparatus of claim 19 further comprising a controller configured to adjust the radiant energy emitted by the first and second arrays of LED lamps.

21. The apparatus of claim 20, wherein the controller is configured to respond to a failure by at least one LED lamp.

22. The apparatus of claim 21, wherein the controller is configured to respond to a signal indicative of a temperature within the chamber.

23. The apparatus of claim 22, wherein the controller is configured to respond to preprogramming.

24. The apparatus of claim 20, further comprising a temperature compensation ring surrounding the susceptor.

25. A chemical vapor deposition apparatus, comprising:

a process chamber having an area for horizontal positioning of a substrate within a substrate treatment zone and having chamber walls for conducting a flow of gas across a surface of the substrate;

a first two-dimensional array of heat lamps being disposed generally above the substrate treatment zone, each LED of the first two-dimensional array of heat lamps having a length and a width so that the first two-dimensional array of heat lamps spans the substrate treatment zone in a first row and spans the substrate treatment zone in a first column generally perpendicular to the first row;

a first perforated reflector located between the first two-dimensional array of heat lamps and the substrate, the perforations being substantially aligned with the first two-dimensional array of heat lamps;

a second two-dimensional array of heat lamps being disposed generally below said substrate treatment zone, each LED of the second two-dimensional array of heat lamps having a length and a width so that the second two-dimensional array of heat lamps spans the substrate treatment zone in a second row and spans the substrate treatment zone in a second column, at least one LED from the second row or second column having means for adjusting energy lamp output relative to another of the LEDs from the same second row or column; and a second perforated reflector located between the second two-dimensional array of heat lamps and the substrate, the perforations being substantially aligned with the second two-dimensional array of heat lamps.

26. The apparatus of claim 25 further comprising a temperature sensor configured to generate a signal indicative of a temperature in the substrate treatment zone.

27. The apparatus of claim 26 further comprising a controller configured to adjust the radiant energy emitted by the at least one LED from the second row or second column relative to another of the LEDs from the same second row or column.

28. The apparatus of claim 27 wherein the controller is configured to respond to the signal.

29. The apparatus of claim 27, wherein the controller is configured to respond to a failure by the first and second two-dimensional arrays of heat lamps.

30. The apparatus of claim 27, wherein the controller is configured to respond to preprogramming.

31. A method of processing a substrate in a chamber by applying heat from an LED lamp disposed adjacent to the chamber, the LED lamp being configured to emit directional radiant energy towards the substrate, the method comprising:

inserting a wafer in a chamber;

applying heat from the LED lamp to the wafer;

identifying nonuniformities in the temperature of the wafer; and adjusting an energy level output of the LED lamp to compensate for the nonuniformity.

32. The method of claim 31, further comprising adjusting an energy level output of a second LED lamp to compensate for the nonuniformity, the second LED lamp being configured to emit directional radiant energy towards the substrate.

* * * * *